United States Patent
Ho et al.

(10) Patent No.: US 10,501,660 B2
(45) Date of Patent: Dec. 10, 2019

(54) METHOD OF SELECTIVELY REMOVING TUNGSTEN OVER SILICON OXIDE

(71) Applicant: UWIZ Technology Co., Ltd., Taoyuan (TW)

(72) Inventors: Yun-Lung Ho, Miaoli County (TW); Chung-Wei Chiang, Taoyuan (TW); Song-Yuan Chang, Chiayi County (TW); Ming-Hui Lu, Taipei (TW); Ming-Che Ho, Taoyuan (TW)

(73) Assignee: UWIZ Technology Co., Ltd., Taoyuan (TW)

( * ) Notice: Subject to any disclaimer, the term of this patent is extended or adjusted under 35 U.S.C. 154(b) by 0 days.

(21) Appl. No.: 16/297,745

(22) Filed: Mar. 11, 2019

(65) Prior Publication Data

US 2019/0203073 A1    Jul. 4, 2019

Related U.S. Application Data

(63) Continuation-in-part of application No. 15/176,162, filed on Jun. 8, 2016, now abandoned.

(30) Foreign Application Priority Data

Mar. 1, 2016    (TW) .............................. 105106055 A

(51) Int. Cl.
*C09G 1/02* (2006.01)
*H01L 21/321* (2006.01)
*B24B 37/24* (2012.01)

(52) U.S. Cl.
CPC ............ *C09G 1/02* (2013.01); *H01L 21/3212* (2013.01); *B24B 37/24* (2013.01)

(58) Field of Classification Search
CPC ........ C09G 1/02; H01L 21/3212; B24B 37/24
See application file for complete search history.

(56) References Cited

U.S. PATENT DOCUMENTS

2004/0229461 A1*   11/2004   Darsillo ................... C09G 1/02
                                                        438/689

* cited by examiner

*Primary Examiner* — Nadine G Norton
*Assistant Examiner* — Mahmoud Dahimene
(74) *Attorney, Agent, or Firm* — JCIPRNET

(57) ABSTRACT

Provided is a slurry composition including abrasive particles, halogen oxide, and nitroxide compound. The combination of halogen oxide and nitroxide compound has a synergistic effect to remove a substrate containing tungsten and silicon oxide. Moreover, a use of the slurry composition and a polishing method using the slurry composition are provided.

8 Claims, No Drawings

METHOD OF SELECTIVELY REMOVING TUNGSTEN OVER SILICON OXIDE

CROSS-REFERENCE TO RELATED APPLICATION

This application is a continuation-in-part application of and claims the priority benefit of U.S. application Ser. No. 15/176,162, filed on Jun. 8, 2016, now pending, which claims the priority benefit of Taiwan application serial no. 105106055, filed on Mar. 1, 2016. The entirety of each of the above-mentioned patent applications is hereby incorporated by reference herein and made a part of this specification.

BACKGROUND

Field of the Invention

The invention relates to a composition, a use thereof, and a polishing method, and more particularly, to a slurry composition, a use thereof, and a polishing method using the slurry composition.

Description of Related Art

Chemical-mechanical polishing of tungsten metal is mainly based on Fenton's reaction, that is, a trivalent iron ion is used as the catalyst, hydrogen peroxide is used as the oxidant, and therefore the tungsten metal removal rate can be increased. However, with the development of Moore's Law, the size of the transistor is getting smaller, and the tungsten metal layer is also becoming thinner. In the case of a fin-type field effect transistor containing a tungsten metal gate, when the tungsten metal layer is thinner, the tungsten metal removal rate of the tungsten metal slurry based on Fenton's reaction is too large, such that the removal surface is uneven and tungsten metal remains as a result. Moreover, to remove the remaining tungsten metal and increase the removal time, dishing defect is increased, such that the tungsten metal thickness is insufficient, and resistance is increased as a result. Moreover, the catalysis of the metal ion causes the pot life of the tungsten metal slurry based on Fenton's reaction to be reduced due to excessive decomposition speed of the oxidant.

SUMMARY OF THE INVENTION

The invention provides a slurry composition, a use thereof, and a polishing method having lower tungsten metal removal rate and lower static etch rate.

The invention provides a slurry composition, a use thereof, and a polishing method capable of adjusting the selection ratio of tungsten metal and silicon oxide as needed.

The invention provides a slurry composition, a use thereof, and a polishing method having longer pot life.

The invention provides a slurry composition including a plurality of abrasive particles, halogen oxide, and nitroxide compound.

In an embodiment of the invention, the abrasive particles are selected from colloidal silicon oxide, fumed silicon oxide, nano aluminum oxide, or a combination of any two or more of the above.

In an embodiment of the invention, the halogen oxide is selected from chlorate, bromate, iodate, sodium hypochlorite, or a combination of any two or more of the above. The counter-ion for chlorate, bromate or iodate may be sodium, or potassium.

In an embodiment of the invention, the nitroxide compound is selected from pyridine-N-oxide, 4-methylpyridine-N-oxide, 2-methylpyridine-N-oxide, N-methylmorpholine-N-oxide, 5.5-dimethyl-1-pyrroline N-oxide, trimethylamine oxide, quinoline oxide, 2-mercaptopyridine oxide, or a combination of any two or more of the above.

In an embodiment of the invention, at least one nitrogen atom in the nitroxide compound is directly bonded to an oxygen atom.

In an embodiment of the invention, the content of the abrasive particles is 0.5 wt % to 10 wt %.

In an embodiment of the invention, the content of halogen oxide is 100 ppm to 10000 ppm.

In an embodiment of the invention, the content of nitroxide compound is 100 ppm to 10000 ppm.

In an embodiment of the invention, the content of nitroxide compound is 300 ppm to 3000 ppm.

In an embodiment of the invention, the pH value of the slurry composition is between 2 and 6.

In an embodiment of the invention, the slurry composition further includes water-soluble starch having a molecular weight less than 8000.

In an embodiment of the invention, the content of the water-soluble starch is 100 ppm to 500 ppm.

In an embodiment of the invention, the slurry composition can be used to perform chemical-mechanical polishing on a substrate containing tungsten and silicon oxide, wherein when the content of the abrasive particles is 0.5 wt % to 10 wt % and the content of the halogen oxide is greater than or equal to 3000 ppm, the removal ratio of tungsten to silicon oxide is greater than 1.

In an embodiment of the invention, the slurry composition can be used to perform chemical-mechanical polishing on a substrate containing tungsten and silicon oxide, wherein when the content of the abrasive particles is 7.5 wt % to 10 wt % and the content of halogen oxide is less than or equal to 1600 ppm, the removal ratio of tungsten to silicon oxide is less than 1.

The invention provides a use of the slurry composition for polishing a substrate containing tungsten and silicon oxide.

The invention provides a polishing method, including using the slurry composition to perform polishing on a substrate containing tungsten and silicon oxide.

Based on the above, in the invention, via the combination of halogen oxide and nitroxide compound, a synergistic effect can be achieved so as to provide lower tungsten metal removal rate and lower static etch rate. Moreover, in the invention, since a metal ion catalyst and an oxidant that is readily decomposed (such as hydrogen peroxide) are not included, the slurry composition of the invention can provide a longer pot life. Moreover, in the slurry composition of the invention, the selection ratio of tungsten metal and silicon oxide can be adjusted as needed, and therefore the slurry composition of the invention is suitable for an advanced process or the polishing process of a thinner tungsten metal layer.

In order to make the aforementioned features and advantages of the disclosure more comprehensible, embodiments accompanied with figures are described in detail below.

DESCRIPTION OF THE EMBODIMENTS

First, the slurry composition of the present embodiment is described. The slurry composition of the present embodiment is suitable for a chemical-mechanical polishing method to perform polishing on a substrate containing tungsten and silicon oxide; and a use thereof is, for instance, polishing a substrate containing tungsten and silicon oxide.

The slurry composition of the present embodiment includes a plurality of abrasive particles, halogen oxide, and nitroxide compound. In an embodiment, the pH value of the slurry composition is between 2 and 6.

Specifically, based on the total amount of the slurry composition, the content of the slurry particle can be, for instance, 0.5 wt % to 10 wt %. The abrasive particles are selected from colloidal silicon oxide, fumed silicon oxide, nano aluminum oxide, or a combination of any two or more of the above.

Based on the total amount of the slurry composition, the content of halogen oxide is 100 ppm to 10000 ppm. The halogen oxide is selected from chlorate, bromate, iodate, sodium hypochlorite, or a combination of any two or more of the above.

Based on the total amount of the slurry composition, the content of nitroxide compound is 100 ppm to 10000 ppm. In another embodiment, the content of nitroxide compound is 300 ppm to 3000 ppm. The nitroxide compound is selected from

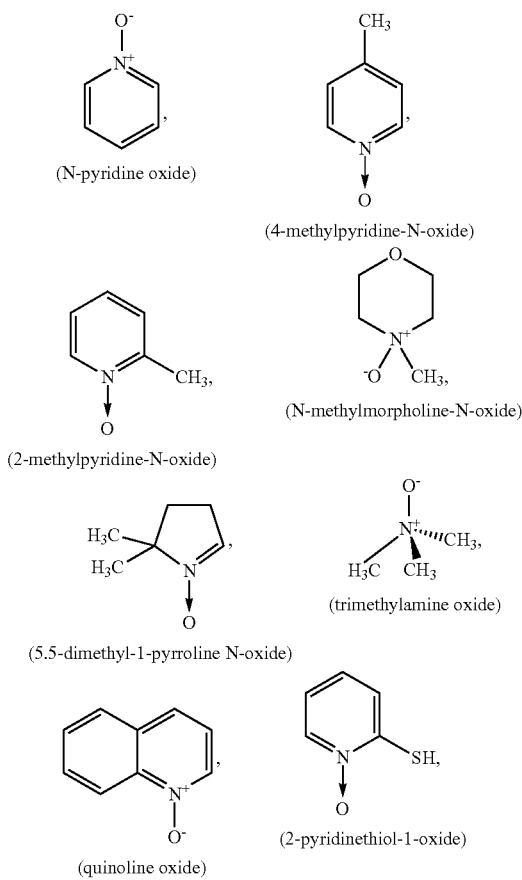

or a combination of any two or more of the above. More specifically, at least one nitrogen atom in nitroxide compound can be directly bonded to an oxygen atom.

It should be mentioned that, the combination of halogen oxide and nitroxide compound of the present embodiment provides a synergistic effect. Specifically, the slurry composition of the present embodiment is used to perform a chemical-mechanical polishing process on a substrate containing tungsten and silicon oxide. As a result, a tungsten/silicon oxide removal rate of 50 Å/minute to 1000 Å/minute can be achieved. In comparison to prior art, the slurry composition of the present embodiment has lower tungsten metal removal rate and lower static etch rate. As a result, the slurry composition of the present embodiment is suitable for an advanced process or the polishing process of a thinner tungsten metal layer.

Moreover, in the slurry composition of the invention, the selection ratio of tungsten metal and silicon oxide can be adjusted as needed. In an embodiment, the slurry composition is used to perform chemical-mechanical polishing on a substrate containing tungsten and silicon oxide, wherein when the content of the abrasive particles is 0.5 wt % to 10 wt % and the content of halogen oxide is greater than or equal to 3000 ppm, the removal ratio of tungsten to silicon oxide is greater than 1. However, the invention is not limited thereto, and in another embodiment, when the content of the abrasive particles is 7.5 wt % to 10 wt % and the content of halogen oxide is less than or equal to 1600 ppm, the removal ratio of tungsten to silicon oxide can also be less than 1. In another embodiment, the content of the abrasive particles and the content of halogen oxide can also be adjusted, such that the removal ratio of tungsten to silicon oxide is equal to 1.

Moreover, since the slurry composition of the present embodiment does not contain a metal ion catalyst and an oxidant that is readily decomposed (such as hydrogen peroxide), the slurry composition of the present embodiment can provide a longer pot life. As a result, the slurry composition of the present embodiment can lower the cost of a chemical-mechanical polishing process. In an embodiment, the pot life of the slurry composition can be greater than or equal to 1 week. Moreover, since the slurry composition of the present embodiment does not contain a metal ion catalyst and an oxidant that is readily decomposed, the slurry composition also does not need a metal ion chelate or a deactivating agent to extend the pot life or prevent over-polishing.

In an embodiment, the slurry composition can further include water-soluble starch having a molecular weight less than 8000. Based on the total amount of the slurry composition, the content of the water-soluble starch is 100 ppm to 500 ppm. In the present embodiment, when potassium iodate is used as the oxidant and tungsten metal polishing is performed, the water-soluble starch can generate a complex with the resulting iodine element ($I_2$) to prevent the iodine element (or iodine vapor) from volatilizing and escaping into air.

<Experiments>

In the following, actual experimental testing is performed. The chemical mechanical polishing machine and the experimental settings used in experimental example 1 and comparative examples 1 to 8 are as follows:

Chemical-mechanical polishing machine: 8-inch Mirra polisher
Substrate to be polished: a substrate containing tungsten and silicon oxide
Polishing pad: IC1000 (product name, made by Dow Chemical Company)
Polishing head down force: 1.5 psi
Platen speed: 73 rpm
Polishing head speed: 67 rpm
Polishing time: 60 seconds The slurry compositions of experimental example 1 and comparative examples 1 to 8 all contain 1 wt % of the abrasive particles, water is the carrier, and the pH value is acidic. Specifically, the slurry composition of experimental example 1 has potassium iodate ($KIO_3$) in a content of 3000 ppm and N-methylmorpholine-N-oxide (NMO) in a content of 3000 ppm, wherein the amount is based on the total amount of the slurry composition, and the definition of the amount is not repeated herein. The slurry compositions of comparative examples 1 and 2 only have potassium iodate, and the amount thereof is respectively 100 ppm and 3000 ppm. The slurry compositions of comparative examples 3 and 4 only have NMO, and the amount thereof is respectively 100 ppm and 3000 ppm. The slurry composition of comparative example 5 has potassium iodate in a content of 3000 ppm and hydrogen peroxide ($H_2O_2$) in a content of 10000 ppm. The slurry composition of comparative example 6 has NMO in a content of 3000 ppm and hydrogen peroxide ($H_2O_2$) in a content of 10000 ppm. The slurry composition of comparative example 7 has potassium iodate in a content of 3000 ppm and ammonium persulfate (($NH_3)_2S_2O_8$) in a content of 10000 ppm. The slurry composition of comparative example 8 has NMO in a content of 3000 ppm and ammonium persulfate (($NH_3)_2S_2O_8$) in a content of 10000 ppm.

The polishing results of the slurry compositions of experimental example 1 and comparative examples 1 to 8 respectively on the substrate containing tungsten and silicon oxide are as shown in Table 1.

over, it can be known from the results of comparative examples 1 to 4 that, the content of the oxidant (i.e., potassium iodate or NMO) has a lesser effect on the silicon oxide removal rate.

Moreover, similar to the chemical-mechanical polishing machine and the experimental settings above, a polishing process is performed on a substrate containing tungsten and silicon oxide respectively using the slurry compositions of experimental examples 1 to 6, and the polishing results thereof are as shown in Table 2.

TABLE 2

| Item | Abrasive particles (wt %) | NMO (ppm) | $KIO_3$ (ppm) | Tungsten removal rate (Å/min) | Silicon oxide removal rate (Å/min) |
| --- | --- | --- | --- | --- | --- |
| Experimental example 2 | 0.5 | 3000 | 3000 | 541 | 98 |
| Experimental example 1 | 1 | 3000 | 3000 | 548 | 121 |
| Experimental example 3 | 5 | 3000 | 3000 | 552 | 227 |
| Experimental example 4 | 10 | 3000 | 3000 | 560 | 558 |
| Experimental example 5 | 7.5 | 3000 | 1600 | 372 | 401 |
| Experimental example 6 | 10 | 3000 | 1600 | 382 | 557 |

TABLE 1

| Item | $KIO_3$ (ppm) | NMO (ppm) | $H_2O_2$ (ppm) | $(NH_3)_2S_2O_8$ (ppm) | Tungsten removal rate (Å/min) | Silicon oxide Removal rate (Å/min) |
| --- | --- | --- | --- | --- | --- | --- |
| Comparative example 1 | 100 | 0 | 0 | 0 | 30 | 129 |
| Comparative example 2 | 3000 | 0 | 0 | 0 | 50 | 138 |
| Comparative example 3 | 0 | 100 | 0 | 0 | 5 | 120 |
| Comparative example 4 | 0 | 3000 | 0 | 0 | 15 | 136 |
| Experimental example 1 | 3000 | 3000 | 0 | 0 | 548 | 121 |
| Comparative example 5 | 3000 | 0 | 10000 | 0 | 52 | 122 |
| Comparative example 6 | 0 | 3000 | 10000 | 0 | 18 | 134 |
| Comparative example 7 | 3000 | 0 | 0 | 10000 | 48 | 111 |
| Comparative example 8 | 0 | 3000 | 0 | 10000 | 20 | 122 |

It can be known from comparative examples 1 to 4 that when potassium iodate and NMO exist independently, a lower removal rate of tungsten metal is achieved. However, when potassium iodate and NMO both exist, as shown in example 1, the removal rate of tungsten metal can be significantly increased.

Moreover, when potassium iodate and NMO are independently mixed with 1 wt % hydrogen peroxide ($H_2O_2$) or 1 wt % ammonium persulfate, a significant increase in the removal rate of tungsten metal thereof is not observed, as shown in comparative examples 5 to 8. Therefore, the mixture (or combination) of potassium iodate and NMO has a specificity toward the increase of tungsten metal removal rate, and cannot be achieved by arbitrarily increasing the oxidant concentration or mixing any two oxidants. More- The slurry compositions of experimental examples 1 to 6 contain water as the carrier, the pH value is acidic, and the amounts of the abrasive particles and the oxidant are as shown in Table 2 above. It can be known from experimental examples 1 to 6 that, the content of the abrasive particles has a greater effect on the removal rate of silicon oxide. In other words, a greater content of the abrasive particles indicates greater removal rate of silicon oxide. Moreover, the content of potassium iodate has a greater effect on the removal rate of tungsten metal. In other words, a greater amount of potassium iodate indicates a greater removal rate of tungsten metal. Therefore, in the invention, the selection ratio of tungsten metal to silicon oxide can be adjusted by adjusting the content of the abrasive particles and the content of potassium iodate to make it greater than 1 (as shown in experimental examples 1 to 3), close to 1 (as shown in experimental example 4), or less than 1 (as shown in experimental examples 5 to 6).

Similar to the chemical-mechanical polishing machine and the experimental settings above, a polishing process is performed on a substrate containing tungsten and silicon oxide respectively using the slurry compositions of experimental examples 7 to 14, and the polishing results thereof are as shown in Table 3.

TABLE 3

| Item | $NaClO_3$ (ppm) | $NaBrO_3$ (ppm) | $KIO_3$ (ppm) | NaClO (ppm) | Tungsten removal rate (Å/min) | Silicon oxide removal rate (Å/min) |
|---|---|---|---|---|---|---|
| Experimental example 7 | 100 | 0 | 0 | 0 | 150 | 211 |
| Experimental example 8 | 10000 | 0 | 0 | 0 | 351 | 218 |
| Experimental example 9 | 0 | 100 | 0 | 0 | 122 | 205 |
| Experimental example 10 | 0 | 10000 | 0 | 0 | 261 | 223 |
| Experimental example 11 | 0 | 0 | 100 | 0 | 181 | 230 |
| Experimental example 12 | 0 | 0 | 10000 | 0 | 851 | 228 |
| Experimental example 13 | 0 | 0 | 0 | 100 | 110 | 208 |
| Experimental example 14 | 0 | 0 | 0 | 10000 | 401 | 211 |

The slurry compositions of experimental examples 7 to 14 contain 5 wt % of the abrasive particles and 3000 ppm of NMO, water is used as the carrier, the pH value is acidic, and the type and the content of the halogen oxide thereof are as shown in Table 3 above. As shown in experimental examples 7 to 14, in the halogen oxide, the effect of potassium iodate is better. In other words, the slurry composition containing potassium iodate can achieve a greater removal rate of tungsten metal, and a greater amount of potassium iodate results in a greater removal rate of tungsten metal (as shown in experimental examples 11 to 12). It should also be mentioned that, if potassium iodate is used as the oxidant, then when tungsten metal polishing is performed, iodine element ($I_2$) is readily generated. Therefore, in the invention, water-soluble starch in a content of 100 ppm can be added in the slurry composition to prevent iodine vapor from escaping.

Moreover, similar to the chemical-mechanical polishing machine and the experimental settings above, a polishing process is performed on a substrate containing tungsten and silicon oxide respectively using the slurry compositions of experimental examples 1 and 15 to 19, and the polishing results thereof are as shown in Table 4.

TABLE 4

| Item | Nitroxide compound | Nitroxide compound amount ppm | Tungsten removal rate (Å/min) | Silicon oxide removal rate (Å/min) |
|---|---|---|---|---|
| Experimental example 1 | N-methylmorpholine-N-oxide (NMO) | 3000 | 548 | 121 |
| Experimental example 15 | N-methylmorpholine-N-oxide (NMO) | 300 | 235 | 122 |
| Experimental example 16 | 2-pyridinethiol-1-oxide | 3000 | 501 | 120 |
| Experimental example 17 | 2-pyridinethiol-1-oxide | 300 | 195 | 124 |
| Experimental example 18 | Trimethylamine oxide | 3000 | 493 | 118 |
| Experimental example 19 | Trimethylamine oxide | 300 | 176 | 115 |

The slurry compositions of experimental examples 1 and 15 to 19 contain 1 wt % of the abrasive particles, 3000 ppm of potassium iodate, and 300 ppm or 3000 ppm of nitroxide compound, water is used as the carrier, the pH value is acidic, and the type and the content of nitroxide compound thereof are as shown in Table 4 above. As shown in experimental examples 1 and 15 to 19, NMO has a better effect on the removal rate of tungsten metal, and a greater amount of NMO results in a greater removal rate of tungsten metal (as shown in experimental examples 1 and 15).

Further, more comparison experiments were conducted. Please see Tables 5-6 below. The NMO in Table 1 above was replaced by either 2-mercapto pyridine oxide in Table 5 or trimethylamine oxide in Table 6. From Tables 5 and 6, similar synergistic effects on the tungsten removal rate were also observed.

TABLE 5

| Item | $KIO_3$ (ppm) | 2-mercaptopyridine oxide* (ppm) | $H_2O_2$ (ppm) | $(NH_4)_2S_2O_8$ (ppm) | Tungsten removal rate (Å/min) | Silicon oxide Removal rate (Å/min) |
|---|---|---|---|---|---|---|
| Experimental example 16 | 3000 | 3000 | 0 | 0 | 501 | 120 |
| Comparative example 9 | 0 | 3000 | 0 | 0 | 10 | 130 |
| Comparative example 10 | 0 | 3000 | 10000 | 0 | 12 | 131 |
| Comparative example 11 | 0 | 3000 | 0 | 10000 | 11 | 140 |

*also named as 2-pyridinethiol-1-oxide

TABLE 6

| Item | KIO$_3$ (ppm) | Trimethylamine oxide * (ppm) | H$_2$O$_2$ (ppm) | (NH$_4$)$_2$S$_2$O$_8$ (ppm) | Tungsten removal rate (Å/min) | Silicon oxide Removal rate (Å/min) |
|---|---|---|---|---|---|---|
| Experimental example 18 | 3000 | 3000 | 0 | 0 | 493 | 118 |
| Comparative example 12 | 0 | 3000 | 0 | 0 | 11 | 131 |
| Comparative example 13 | 0 | 3000 | 10000 | 0 | 13 | 132 |
| Comparative example 14 | 0 | 3000 | 0 | 10000 | 14 | 145 |

Based on the above, in the invention, via the combination of halogen oxide and nitroxide compound, a synergistic effect can be achieved so as to provide lower tungsten metal removal rate and lower static etch rate. Moreover, in the invention, since a metal ion catalyst and an oxidant that is readily decomposed (such as hydrogen peroxide) are not included, the slurry composition of the invention can provide a longer pot life. Moreover, in the slurry composition of the invention, the selection ratio of tungsten metal and silicon oxide can be adjusted as needed, and therefore the slurry composition of the invention is suitable for an advanced process or the polishing process of a thinner tungsten metal layer.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of selectively removing tungsten over silicon oxide, the method comprising:
   providing a substrate having a tungsten layer directly disposed in and over a silicon oxide layer; and
   selectively removing the tungsten layer over the silicon oxide layer to leave the tungsten layer in the silicon oxide layer by chemical mechanical polishing using a slurry, wherein the slurry comprises:
   acidic water;
   abrasive particles;
   a halogen oxide, wherein the halogen oxide is a sodium salt or a potassium salt of chlorate, bromate, iodate, hypochlorite, or any combinations thereof; and
   a nitroxide compound, wherein the nitroxide compound is N-methylmorpholine-N-oxide (NMO), 2-mercapto pyridine oxide, trimethyl amine oxide, or any combinations thereof, and the combination of the halogen oxide and the nitroxide compound produce a synergistic effect on the removing rate of the tungsten, compared with using the halogen oxide or the nitroxide compound alone.

2. The method of claim 1, wherein the halogen oxide has a concentration of the halogen oxide is 100-10000 ppm.

3. The method of claim 1, wherein the nitroxide compound has a concentration of 300-3000 ppm.

4. The method of claim 1, wherein the abrasive particles are selected from colloidal silicon oxide, fumed silicon oxide, nano aluminum oxide, or a combination of any two or more of the above.

5. The method of claim 1, wherein a content of the abrasive particles is 0.5-10 wt %.

6. The method of claim 1, wherein the slurry has a pH value of 2-6.

7. The method of claim 1, wherein the slurry further comprises a water-soluble starch having a molecular weight less than 8000.

8. The method of claim 7, wherein a content of the water-soluble starch is 100-500 ppm.

* * * * *